(12) United States Patent
Chang-Hasnain et al.

(10) Patent No.: US 7,304,781 B2
(45) Date of Patent: Dec. 4, 2007

(54) ULTRA BROADBAND MIRROR USING SUBWAVELENGTH GRATING

(75) Inventors: Connie J. Chang-Hasnain, Palo Alto, CA (US); Carlos Fernando Rondina Mateus, San Jose De Campos (BR); Michael Chung-Yi Huang, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/479,986

(22) Filed: Jun. 29, 2006

(65) Prior Publication Data

US 2007/0115553 A1 May 24, 2007

Related U.S. Application Data

(63) Continuation of application No. PCT/US2005/001416, filed on Jan. 14, 2005.

(60) Provisional application No. 60/536,570, filed on Jan. 14, 2004.

(51) Int. Cl.
*G02F 1/07* (2006.01)
(52) U.S. Cl. .................. 359/260; 359/245; 359/238
(58) Field of Classification Search ........... 359/260, 359/245, 239, 238, 569, 558, 563, 566, 570, 359/572
See application file for complete search history.

(56) References Cited

U.S. PATENT DOCUMENTS

| | | | |
|---|---|---|---|
| 6,005,835 A * | 12/1999 | Tsuji et al. ............ | 369/112.15 |
| 6,611,377 B1 | 8/2003 | Chung | |
| 6,836,501 B2 * | 12/2004 | Cox et al. ............... | 372/108 |
| 7,190,657 B2 * | 3/2007 | Shin et al. .............. | 369/112.1 |
| 2004/0156590 A1 * | 8/2004 | Gunn et al. ............. | 385/37 |
| 2006/0181704 A1 * | 8/2006 | Cunningham et al. .... | 356/326 |
| 2007/0014515 A1 * | 1/2007 | Sugawara et al. ........ | 385/27 |
| 2007/0035847 A1 * | 2/2007 | Li et al. .................. | 359/642 |

* cited by examiner

Primary Examiner—Timothy Thompson
(74) Attorney, Agent, or Firm—John P. O'Banion

(57) ABSTRACT

A sub-wavelength grating structure that has a very broad reflection spectrum and very high reflectivity comprising segments made of high refractive index material disposed on a layer of low refractive index material and a low refractive index material disposed above and between the segments. The index differential between the high and low index materials determines the bandwidth and modulation depth. The larger difference in refractive indices gives rise to wider reflection bands. The reflection is sensitive to parameters such as the grating period, the grating thickness, the duty cycle of the grating, the refractive index and the thickness of the low index layer underneath the grating. The design is scalable for different wavelengths, and facilitates monolithic integration of optoelectronic devices at a wide range of wavelengths from visible to far infrared. The sub-wavelength grating reflectors may be used in a variety of settings such as tunable etalon filters and as a replacement for conventional distributed Bragg reflectors.

34 Claims, 12 Drawing Sheets

ULTRA BROADBAND MIRROR USING SUBWAVELENGTH GRATING

CROSS-REFERENCE TO RELATED APPLICATIONS

This application claims priority from, and is a 35 U.S.C. § 111(a) continuation of, co-pending PCT international application serial number PCT/US2005/001416, filed on Jan. 14, 2005, incorporated herein by reference in its entirety, which designates the U.S., which claims priority from U.S. provisional application Ser. No. 60/536,570, filed on Jan. 14, 2004, incorporated herein by reference in its entirety.

STATEMENT REGARDING FEDERALLY SPONSORED RESEARCH OR DEVELOPMENT

This invention was made with Government support under a grant from DARPA (Center for Bio-Optelectronic Sensor Systems [BOSS]), Contract No. MDA9720010020. The Government has certain rights in this invention.

This application is also related to PCT International Publication No. WO 2005/089098 A2 and WO 2005/089098 A3, each of which is incorporated herein by reference in its entirety.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

This invention pertains generally to broadband mirrors, and more particularly to high reflectivity gratings.

2. Description of Related Art

Broadband mirrors ($\Delta\lambda/\lambda>15\%$) with very high reflectivity ($R>99\%$) are essential for numerous applications, including telecommunications, surveillance, sensors and imaging, ranging from 0.7 μm to 12 μm wavelength regimes. For example, in optical integrated circuits, electro-optic modulators play an important role in switching and signal encoding. Ideally, electro-optic modulators have low insertion loss and wide bandwidth. Mirrors are key components in many modulators so that a low insertion loss, broad bandwidth mirror would greatly improve the performance of these modulators.

Among the candidates for mirrors are metal mirrors and dielectric mirrors. Metal mirrors have comparatively large reflection bandwidths but lower reflectivities (R), as they are limited by absorption loss. As a result, they are not suitable for fabricating transmission-type optical devices such as etalon filters.

Dielectric mirrors on the other hand have a lower loss than metal mirrors and therefore can achieve a higher reflectivity. However, the deposition methods are often not precise enough to lead to very high reflectivities. Dielectric mirrors are composed of multi-layer dielectric materials with different dielectric indices, like distributed Bragg reflectors. Distributed Bragg Reflectors (DBR) consist of multiple periods of alternating high and low refractive index layers. The tuning range for a tunable filter made with DBR mirrors is determined by the DBR mirror bandwidth and the maximum allowable mechanical movement, whichever is smaller. These mirrors have low absorption loss, but the modulation depth, bandwidth and band location depend on the refractive index contrast of the constituent materials as well as on the control over the layer thickness.

In order to minimize interface disorder and strain in the multilayer structures, typical combinations of materials often have small refractive index differences, thus resulting in rather small bandwidths ($\Delta\lambda/\lambda\approx3-9\%$). The narrow bandwidth limits the tuning range of the electro-optic modulators like the etalon type devices.

For tunable etalon type devices, such as micro-electro-mechanical (MEM) vertical cavity surface emitting lasers (VCSEL), filters and detectors, the tuning range is often limited by semiconductor based distributed Bragg reflectors (DBRs) to $\Delta\lambda/\lambda\approx3-9\%$. The challenge of designing a mirror with broadband reflection, low loss and compatibility with optoelectronic processing has yet to be overcome.

Accordingly, there is a need for highly reflective and ultra-broad bandwidth mirror that is low loss, compatible with semiconductor device fabrication processes and scalable with different wavelength regimes for different application requirements. The present invention satisfies that need as well as others and generally overcomes the limitations of the art.

BRIEF SUMMARY OF THE INVENTION

The present invention generally comprises a sub-wavelength grating that has a very broad reflection spectrum and very high reflectivity. The design is scalable for different wavelengths, and facilitates monolithic integration of optoelectronic devices at a wide range of wavelengths from visible to far infrared.

The structure generally comprises a one dimensional grating structure with lines made of high refractive index material sandwiched between two low refractive index materials on top and bottom. The index difference between the high and low index materials determines the bandwidth and modulation depth. The larger difference in refractive indices gives rise to wider reflection bands. The reflection is sensitive to parameters such as the grating period, the grating thickness, the duty cycle of the grating, the refractive index and the thickness of the low index layer underneath the grating.

Several examples are provided to illustrate the functionality of the sub-wavelength grating reflector. One example describes a reflector with $R>99\%$ with $\Delta\lambda/\lambda>30\%$ for a wavelength range centered at 1.55 μm.

Micro-electro-mechanical systems (MEMS) provide a simple wavelength tuning mechanism for many optoelectronic devices. The major advantages of MEMS-based tunable filters include a large tuning range, continuous tuning with high precision, a narrow passband and a fast response time (1-10 microseconds). The basic concept is based on scanning Fabry-Perot (FP) etalon with an integrated MEMS drive to provide precise physical change of the cavity length. A conventional etalon comprises two mirrors separated by a cavity gap. The filter can be tuned by moving one of the mirrors relative to the other changing the dimensions of the air gap. Thus, conventional MEMS-based tunable filters have the advantage of continuous tuning in that variation of the etalon gap size results in the variation in the transmission wavelength. However, existing filters have a limited tuning range ($\Delta\lambda/\lambda \sim 7\%$) and have mechanical structures that have a small optical fill factor and are difficult to fabricate. The present invention provides a tunable filter using sub-wavelength grating structures as the reflectors that provides a much larger tuning range ($\Delta\lambda/\lambda > 30\%$) in the far-infrared wavelength (FIR) regime. It will be seen that the MEMS-based optical filter design is flexible and can be scaled to a wide range of wavelengths by simply changing the dimensions of the reflectors. The design also provides a large optical fill factor over existing designs that will permit the fabrication of two-dimensional arrays that require reasonably low driving voltages.

An aspect of the invention is to provide an ultra-broadband mirror using a high refractive index material grating and a layer of low refractive index material under the grating.

According to another aspect of the invention a sub-wavelength grating reflector is provided that has a substrate layer, a layer of low refractive index material disposed on the substrate layer, and a plurality of spaced apart segments of high refractive index material on the layer of low refractive index material.

Another aspect of the invention is to provide a sub-wavelength grating reflector where there is a large differential between the index of refraction of the high refractive index segments and the layer of low refractive index material, preferably greater than one unit.

Still another aspect of the invention is to provide an etalon filter having a first sub-wavelength grating reflector and a second sub-wavelength grating reflector that is substantially parallel to first reflector and separated by a gap and the first and second reflectors comprise a plurality of bands of a high refractive index material disposed on a layer of a low index material.

Another aspect of the invention is to provide an etalon filter with a means for moving the first reflector relative to the second reflector using existing MEMS technology.

A further aspect of the invention is to provide a sub-wavelength grating reflector that can be manufactured with a variety of materials including semiconductors, dielectric materials, metals, Group IV elements, Group III-V compounds, Group II-VI compounds and organic polymers.

Still another aspect of the invention is to provide an etalon filter that has a large fill factor and reduced voltages compared to existing filters.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL
VIEWS OF THE DRAWINGS

The invention will be more fully understood by reference to the following drawings which are for illustrative purposes only:

DETAILED DESCRIPTION OF THE
INVENTION

A broadband mirror with high reflectivity that is suitable for use in applications such as sensors, surveillance, imaging and communications is provided. The reflector structure generally comprises a grating with periodic lines of high and low index material disposed on a low index material and a substrate. A tunable etalon filter with two reflectors with a variable air gap is used to illustrate one use of the sub-wavelength reflectors of the present invention. This device is scalable from visible to far-infrared wavelengths and requires low actuation voltages.

Figure 1:
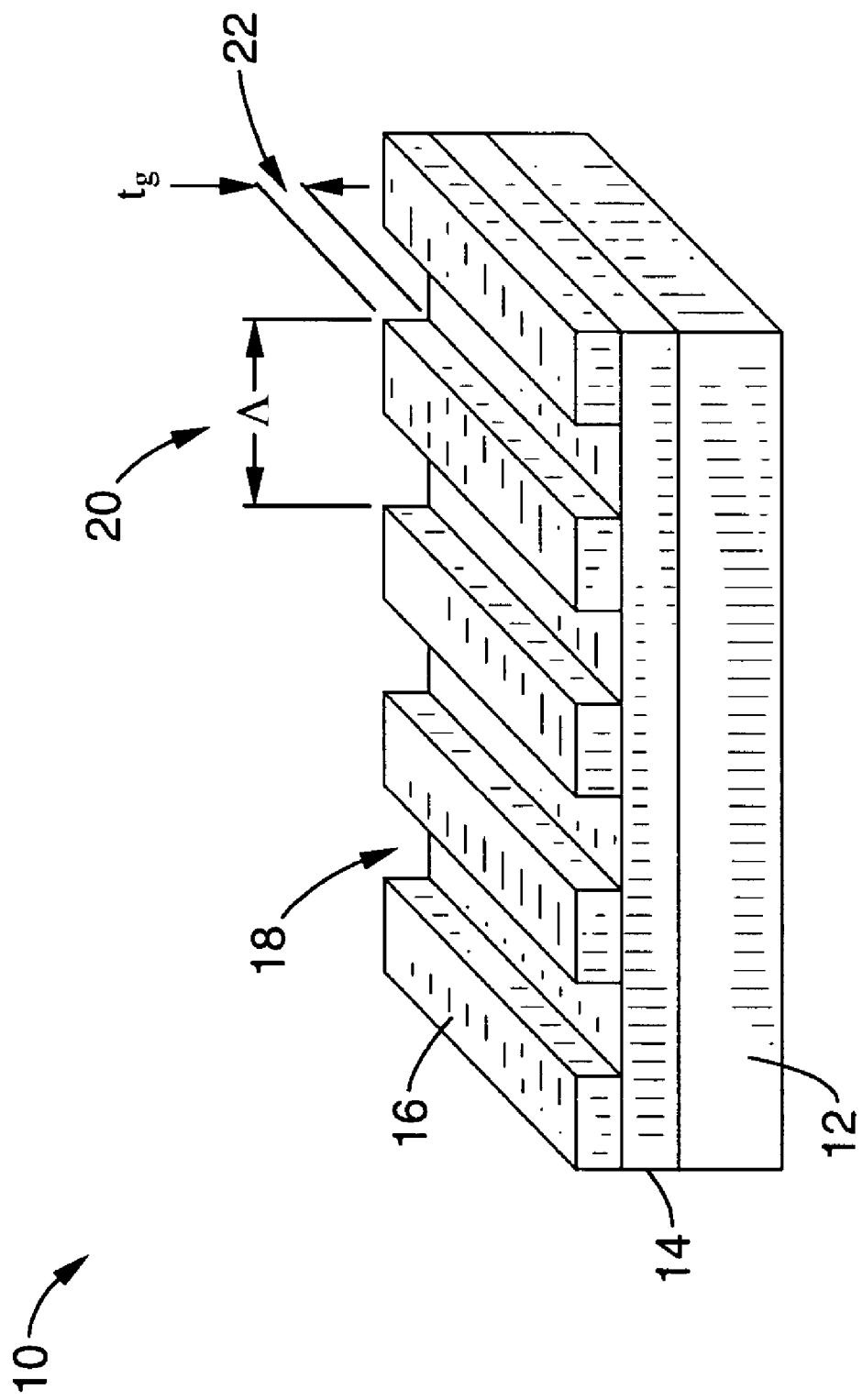
FIG. 1 is a schematic design of a sub-wavelength broadband grating reflector according to the invention.

Referring first to FIG. 1, one embodiment of the grating 10 comprises a substrate layer 12 composed of silicon, a layer of low index material 14 composed of $SiO_2$ over the substrate layer 12, and a plurality of spaced apart sections of high index material 16 made of poly-silicon for purposes of illustration. The spaces 18 between the lines of high index material 16 are air gaps, and the high index material 16 is open to the air (e.g., a second low index layer). Although silicon materials are used as an illustration, it will be understood that many different high and low index materials may be suitable for use with the design. In general, preferred suitable materials will have a large refractive index difference between the two materials that form the grating, for a targeted specific wavelength range, and the optical absorption/loss for the two materials is low. The larger the difference between high and low indices is, the larger the reflection band. Other suitable high/low refractive index materials may include various semiconductors, dielectric materials and metals.

Examples include C; Si; Ge; SiGe; various Group III-V compounds such as $In_xGa_yAl_{1-x-y}As_zP_mSb_{1-z-m}$, [where x,y, m,z are all between 0 and 1]; InGaAsNSb; various Group II-VI compounds (ZnCdSeS with various combinations). Metals include Au, Ag, Al, etc. Dielectric materials include BN, ZnOx, etc. Other combinations that may be used are $Si/TiO_2$, Si/air, $GaAs/AlO_x$ and $ZnSe/CaF_2$ and the like. Organic polymers may also be used for both high and low refractive index materials.

Design parameters for the structure include the materials used (index of refraction), thickness of the low index layer under the grating ($t_L$), the grating period ($\Lambda$), the grating thickness 22 ($t_g$), and the duty cycle. The duty cycle is defined as the ratio of the width of the high index material to the grating period $\Lambda$. The distance between the far edge of one stripe of high index material 16 with the near edge of the adjacent stripe 16 is the grating period 18 ($\Lambda$). Although FIG. 1 describes a uniform grating, it will be understood that the invention will also include nonuniform gratings such as chirped or sampled gratings.

It has been shown that the reflectivity range of the mirror is dependent on the selected grating period 18 ($\Lambda$), the duty cycle and the grating thickness 22 ($t_g$). Accordingly, the sub-wavelength grating 10 (SWG) is scalable for different wavelengths by simply changing its geometrical dimensions. This facilitates the easy fabrication of the reflectors with other optoelectric devices over a wide range of wavelengths, from visible to far infrared, and can be used to create low voltage and widely tunable optical filters.

The present invention may be more particularly described in the following examples that are intended for illustrative purposes only, since numerous modifications, adaptations and variations to the apparatus and methods will be apparent to those skilled in the art.

EXAMPLE 1

Figure 2A:
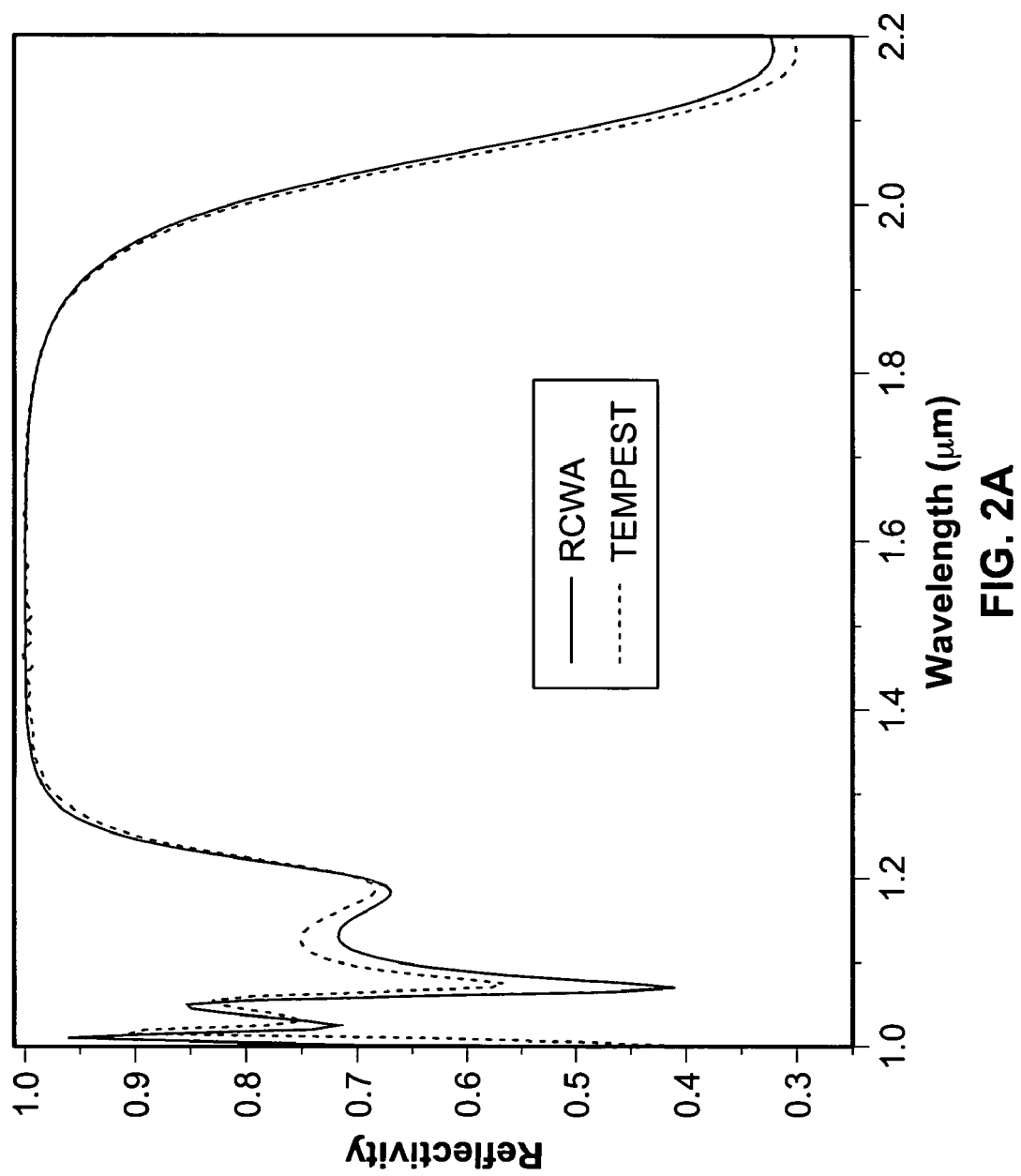
FIG. 2A is a graph of reflectivity versus wavelength of light perpendicular to the grating lines obtained from RCWA and TEMPEST analysis.
Figure 2C:
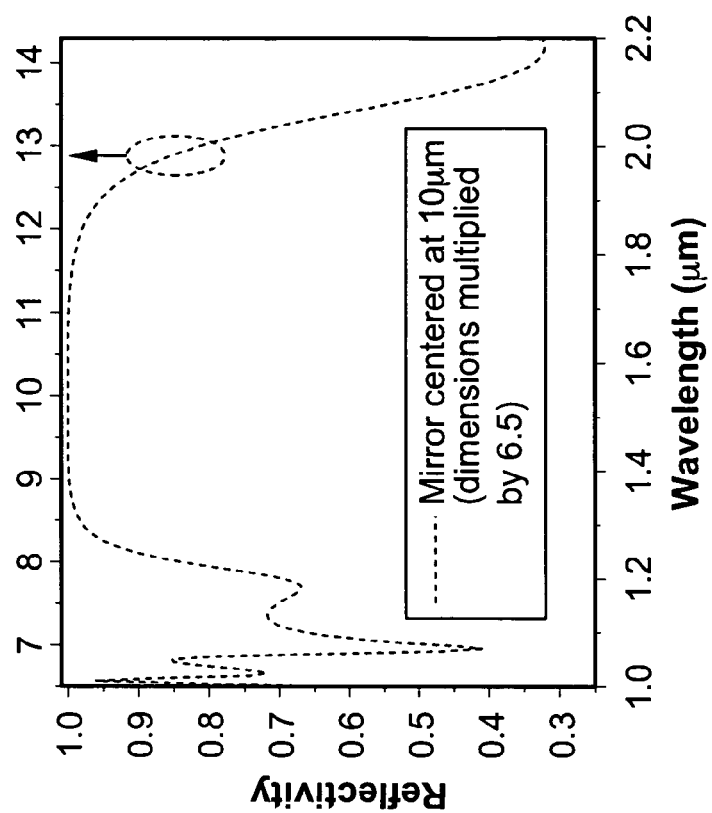
FIG. 2B-2D are graphs that illustrate that the reflectivity spectrum can be scaled with wavelength with the mirror centered at 1.55 µm and 10 µm.

Turning now to FIGS. 2A through 2D, the function of a sub-wavelength grating structure shown in FIG. 1 was simulated and evaluated. A very broadband mirror $\Delta\lambda/\lambda > 30\%$, with R>0.99, was obtained for wavelengths centered around 1.55 µm, over the range 1.33 µm to 1.80 µm, as depicted by FIG. 2(a). The reflection bandwidth of the mirror is also very broad for a higher reflectivity R>0.999 (1.40 µm to 1.67 µm or $\Delta\lambda/\lambda > 17\%$). The parameters used in the simulation were: Si substrate (n=3.48), grating period $\Lambda$=0.7 µm, high index material $n_n$=3.48 (Poly-Si), low index material in and above the grating=1 (air), low index material under the grating $n_L$=1.47 (SiO2), grating thickness $t_g$=0.46 µm and grating duty cycle=0.75. The index of refraction was considered constant along the covered range, which is a very good approximation since most semiconductor materials such as Si, GaAs and ZnSe have index of refraction practically independent of wavelength in the considered ranges.

FIG. 2 illustrates reflected power for linear polarized light in the direction perpendicular to the grating lines. FIG. 2(a) shows the simulation results based on Rigorous Coupled Wave Analysis (RCWA) and confirmed by finite difference time domain electromagnetic propagation using TEMPEST®. The two methods are in excellent agreement and both illustrate the broadband and highly reflective properties of the sub-wavelength grating.

Figure 2B:
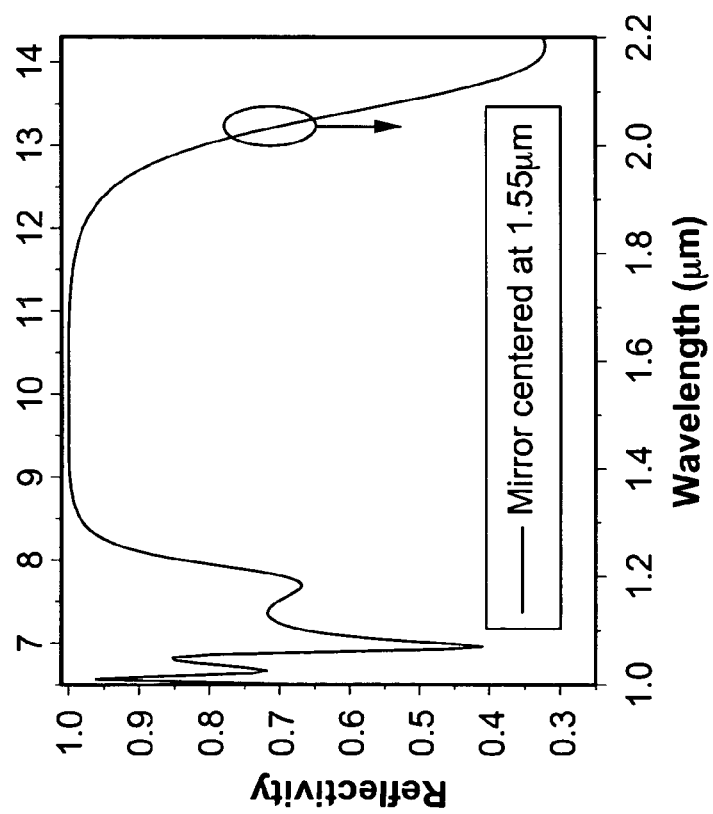
Figure 2D:
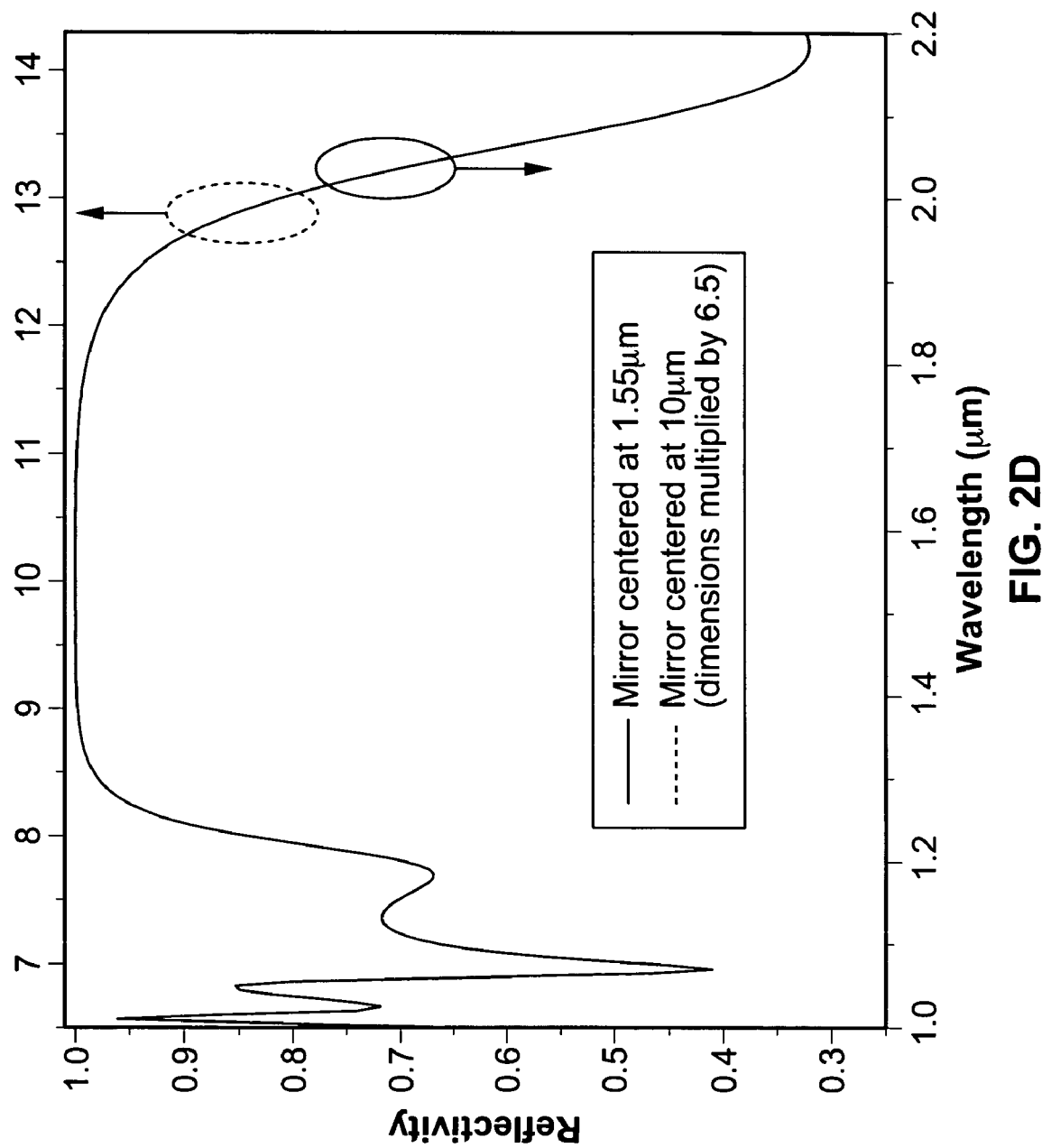

It should be noted that the broadband reflectivity does not result from a resonance, as the period of the grating is sub-wavelength, but not half-wavelength. Furthermore, the reflectivity spectrum can be scaled with wavelength, as shown in FIG. 2(b). By simply multiplying the geometrical dimensions by a constant, in this case 6.5, while keeping the other parameters the same, the reflection band shifts to the 8.6-11.7 µm wavelength range with all features and values being identical. Hence, any different wavelength regime can use the same design. Note that the same constant has also multiplied the horizontal scale in order to make the comparison easier. Although it may be obvious that any periodic structure should be wavelength scalable, the scaling here is easily manufacturable since it only requires changing the layer dimensions.

The low index material layer 14 under the grating 16 is important to obtaining the high broadband reflection. This is shown in FIG. 3(a) and FIG. 3(b), which consists of contour plots of reflectivity as a function of wavelength for various values of $t_L$ and $n_L$, and shows the effect of the low index layer 14 under the grating.

Figure 3A:
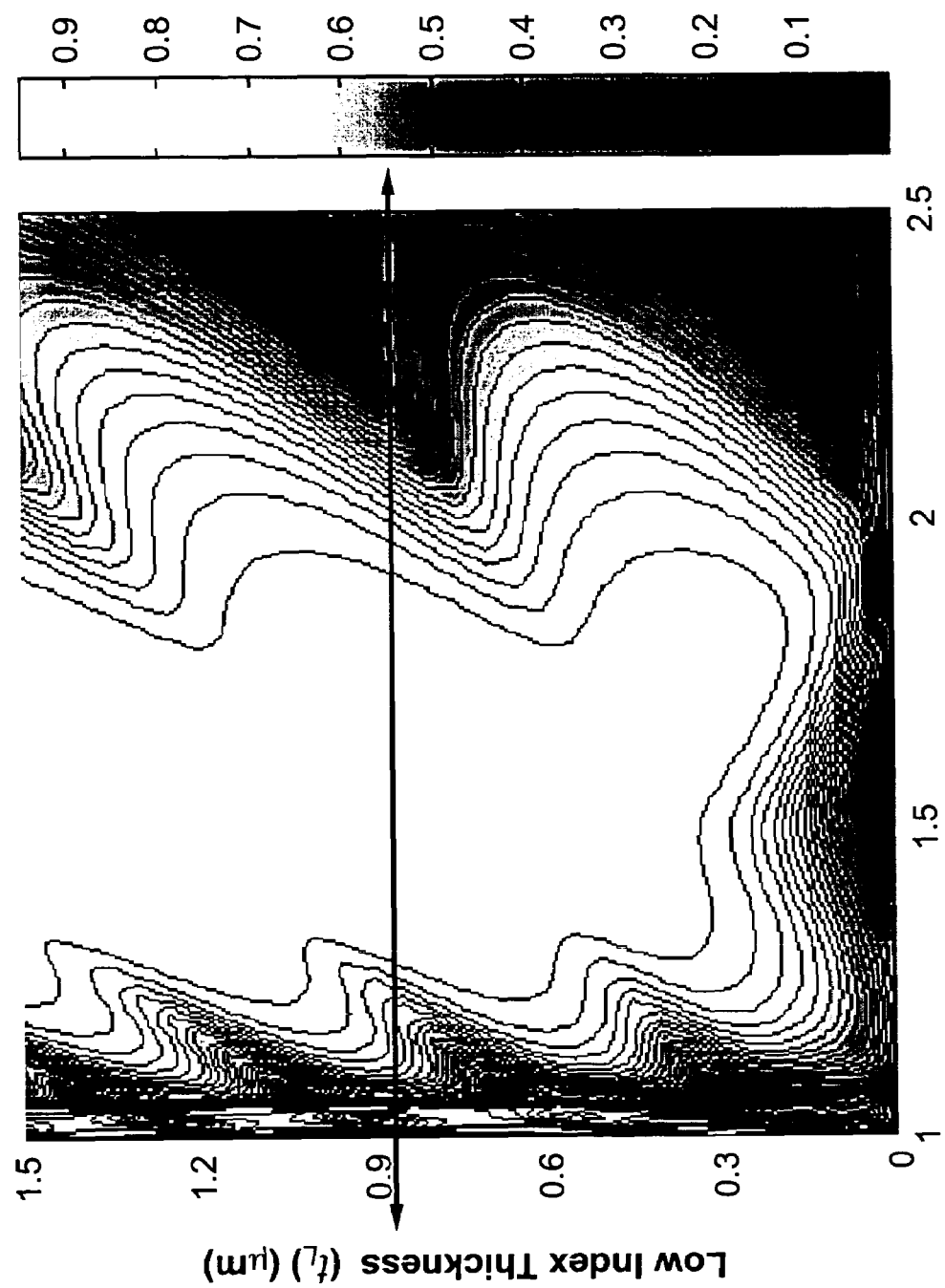
FIG. 3A is a contour map showing reflectivity as a function of wavelength and low index layer thickness ($t_L$).
Figure 3B:
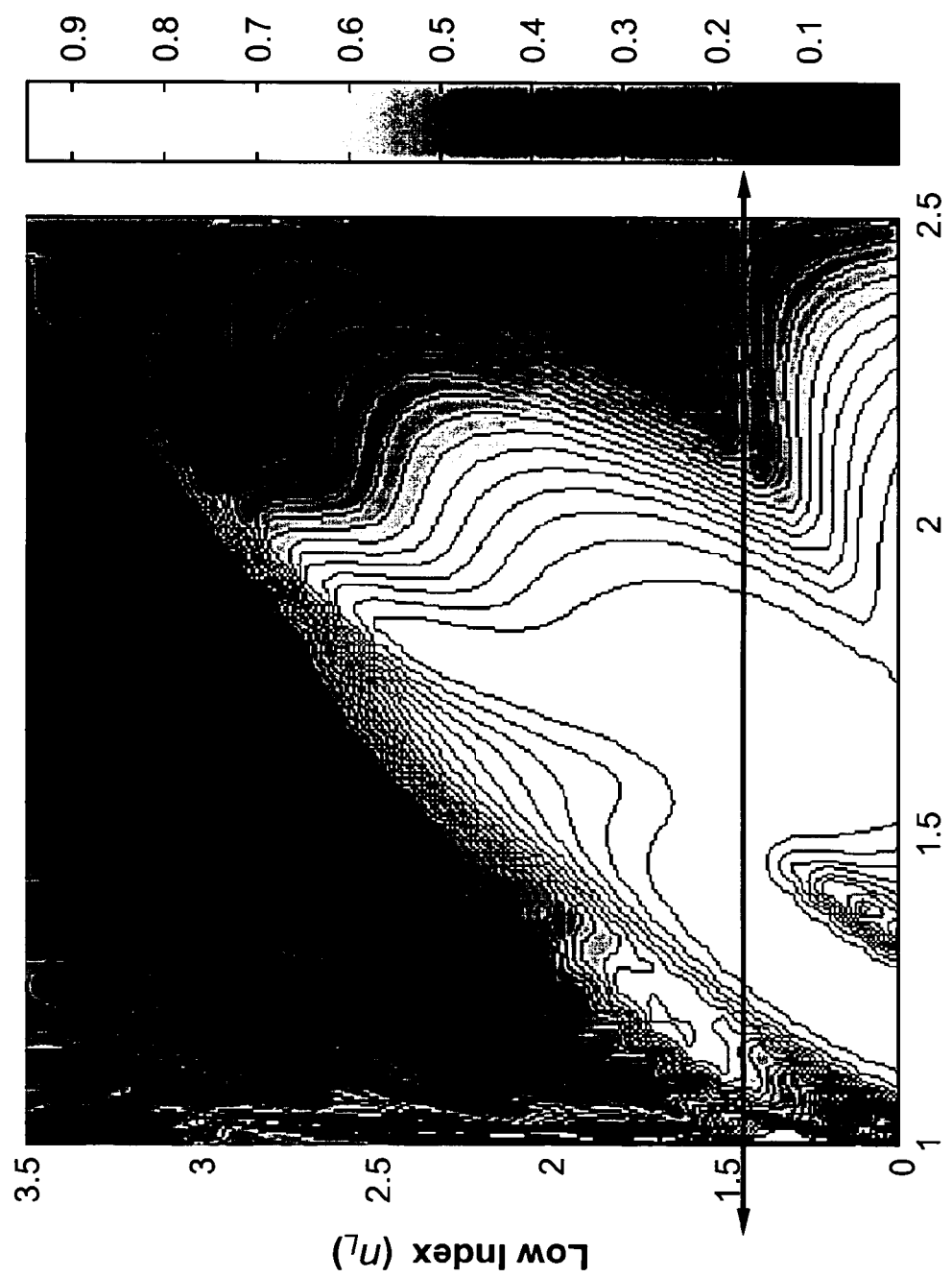
FIG. 3B is a contour map showing reflectivity as a function of wavelength and ($n_L$).

FIG. 3(a) shows reflectivity as a function of wavelength and $t_L$. FIG. 3(b) shows reflectivity as a function of wavelength and $n_L$. Keeping all the other parameters the same, there is no reflection band for $t_L$<0.1 µm. Above this thickness, the structure has low sensitivity to the low index layer 14, but this parameter can be used to optimize the reflection band. The mirror also does not exist if $n_L$>2.5. If $Si_3N_4$ (n≈2) were used instead of $SiO_2$ as the low index material under the grating, the result would be a much smaller reflection band, ranging from 1.7 µm to 1.8 µm.

The various design parameters play a role on the final reflectivity spectrum. It can be seen that any material system with a large difference in index of refraction can be used as a base for this broadband mirror, and the larger this difference, the larger the band. The simulations show results for Poly-Silicon/air/$SiO_2$, however, GaAs/$Al_2O_3$, GaN/air or ZnSe/$CaF_2$ would be comparable. Thus, this grating 10 is a potential candidate for several active and passive devices such as visible and infrared wavelength VCSELs and MEM tunable devices.

Figure 4:
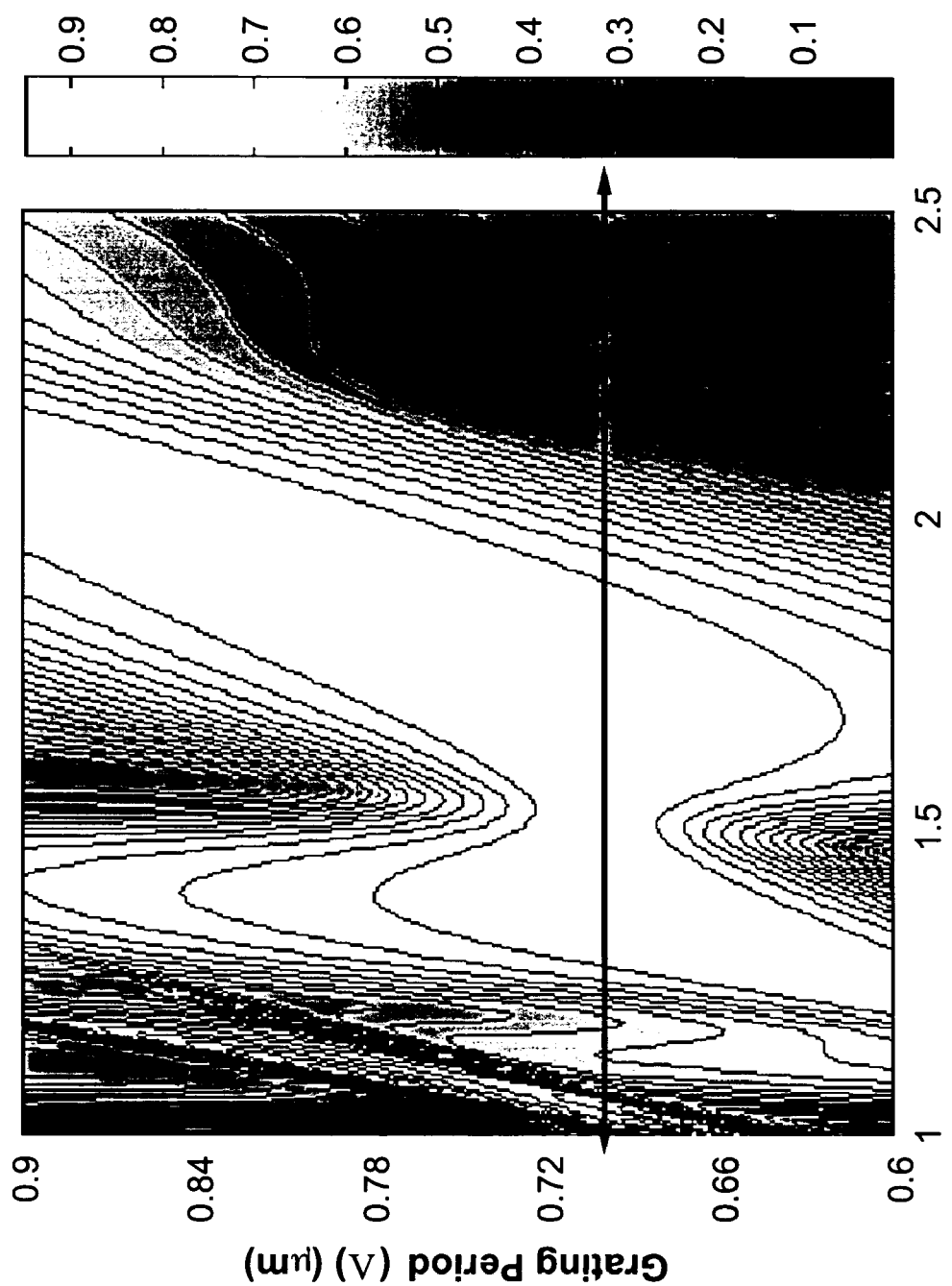
FIG. 4 is a contour map of grating period as a function of wavelength.

It can also be seen that the grating period 20 determines the location of the center wavelength of the reflection band, and this effect is shown in FIG. 4. The band shifts to longer wavelengths proportionally to the grating period $\Lambda$, and for $\Lambda$=0.07 µm the band is the broadest. The period can be controlled very accurately by lithographic methods and thus, the reflection band can be precisely fabricated.

Grating thickness and duty cycle determine the intensity of modulation, or grating strength. However, this strength cannot increase indefinitely and there is an optimum point where the grating effect is strongest with respect to reflectivity.

Figure 5:
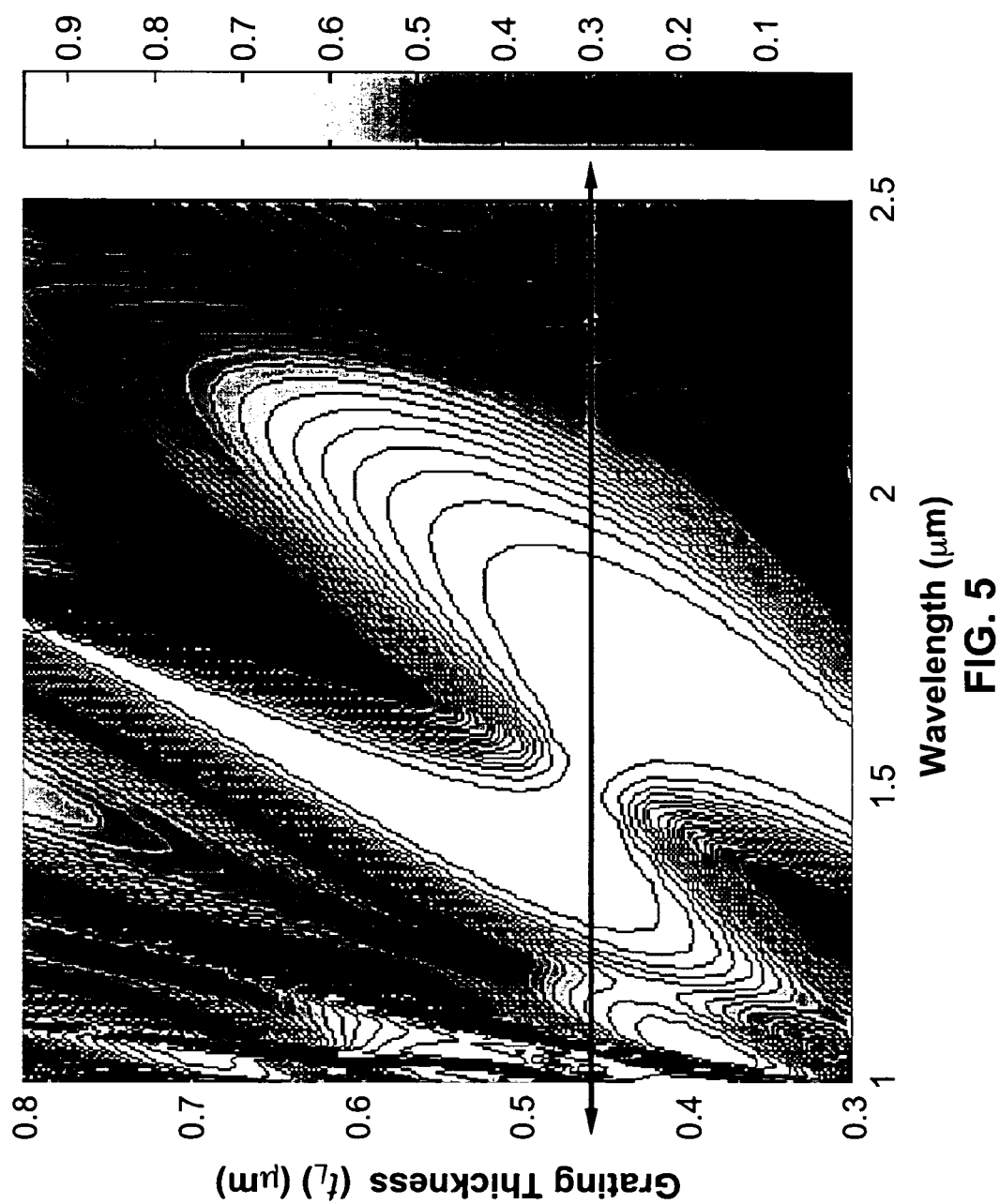
FIG. 5 is a contour map of reflectivity as a function of wavelength and ($t_g$).

FIG. 5 shows reflectivity as a function of wavelength and $t_g$. For a very thin grating, the mirror is sharp and the optimized bandwidth occurs for $t_g$=0.46 µm. Above this value, the mirror gets sharp again. As this parameter can be precisely controlled by epitaxial growth or plasma deposition techniques, the optimized design can be easily fabricated.

Figure 6:
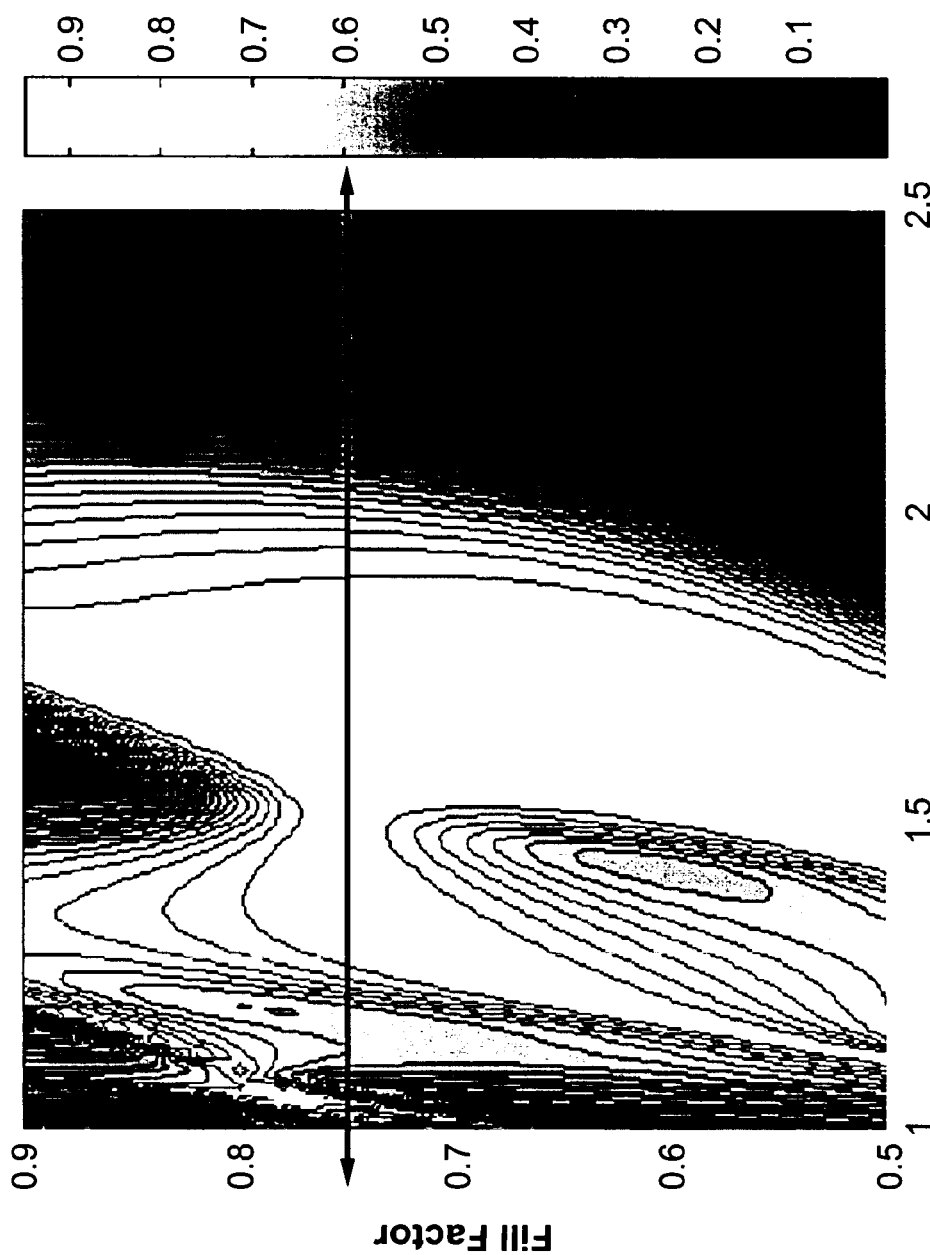
FIG. 6 is a contour map of reflectivity as a function of wavelength and fill factor.

FIG. 6 shows reflectivity as a function of wavelength and duty cycle. It can be seen that there are two reflection peaks for a duty cycle of 0.5, one at 1.1 µm and the other at 1.6 µm. As the duty cycle increases, the two peaks merge to form one broad and flat reflection band. This parameter is one of the most important considerations in fabrication as small variations in lithography can change the final value. It may slightly affect the flatness of the band (if the duty cycle gets smaller, the two peaks tend to separate) or its coverage (if duty cycle gets larger, mirror bandwidth decreases).

In the design of FIG. 1 where a linear grating is used, the reflection is polarization dependent. This can be advantageous to control the polarization on a VCSEL, e.g., if the grating design is used for the mirrors. If a 2D symmetrical grating were used in the alternative, reflectivity would be polarization independent. The grating sensitivity to all these parameters can be optimized iteratively. If the application has a less stringent requirement on reflectivity, i.e. <99%, most of the parameters have a large tolerance range, sometimes up to 10% variation.

As can be seen, therefore, the present invention comprises a sub-wavelength grating that under normal incident light has very broad reflection spectrum (R>99% and $\Delta\lambda/\lambda$>30%). The mirror can be easily scaled by simply multiplying the dimensions by a constant. This design has potential application on micro-electro-mechanical tunable devices, VCSELs and reconfigurable focal plane arrays. It is insensitive to lateral position on cascaded structures and can be easily fabricated monolithically with optoelectronic devices.

EXAMPLE 2

In order to demonstrate the functionality of the design, several single wavelength grating structures according to FIG. 1 were fabricated. The 1D grating structures were formed with stripes of high index material disposed on two low index layers. The high index material was poly-Si $(n_h)$=3.48, and the low index material within the grating was air (n=1). The low index material under the grating was $SiO_2$ with $(n_L)$=1.47 and a thickness $(t_L)$=0.58 μm and $(t_g)$=0.4 μm. The grating period was varied from 0.7 μm to 0.9 μm and the grating duty cycle was varied 40-80%. The duty cycle is defined as the ratio of the width of the high index material to the total period length. Fabrication was conducted on a silicon wafer and e-beam lithography on PMMA was used for lift off of metal as to mask the top oxide layer, which was etched by RIE. The grating is polarization sensitive and light polarized along the grating lines will not see the band gap. However, if the grating has a 2D symmetry it will be polarization insensitive.

The measurement set up included a tungsten halogen light source, polarizer, focusing lens and optical spectrum analyzer (OSA). The output light source was coupled to a fiber bundle on one end and the other end coupled to the polarizer, focusing lens and the grating. Reflected light from the grating is collected by the bundle and coupled to the OSA. The trace was normalized by the reflection of a silver coated mirror rated 98.5% reflectivity from 1.1 μm to 20 μm.

Contour plots of reflectivity as a function of wavelength and duty cycle were generated and evaluated. The broadband effect is achieved for a duty cycle of 68% plus or minus 2%. Very broad bandwidth, 1.12-1.62 μm, with greater than 98.5% reflectivity was achieved with a duty cycle of 66%. This measurement is currently limited by the OSA spectra.

The agreement between the simulation and experimental results was excellent. Small variations on parameters such as the index of refraction or thickness or fill factor may slightly alter the performance.

It can be seen that the sub-wavelength grating is scalable with wavelength and by simply multiplying the period and grating thickness with the same constant. Hence, using the same materials, the mirror reflection can be simply designed by lithography.

EXAMPLE 3

A simple 1D grating was simulated to illustrate the scalability of the single wavelength grating structures and the dependence of reflectivity spectrum on various param-eters. A very broadband mirror with reflectivity larger than 99% is obtained over the range of 1.4 μm to 1.7 μm ($\Delta\lambda/\lambda$>19%). The simulation calculations were performed based on Rigorous Coupled Wave Analysis (RCWA) and confirmed by time-domain electromagnetic propagation using TEMPEST®. The high index material was poly-Si $(n_h)$=3.48, and the low index material within the grating was air (n=1). The low index material under the grating was $SiO_2$ with $(n_L)$=1.47 and a thickness $(t_L)$ =0.5 μm and $(t_g)$=0.46 μm. The fill factor was 0.75. The grating period was 0.7 μm. The index of refraction was considered constant along the coverage range.

It can be seen that the period of the grating is sub-wavelength (but not half wavelength) and a scalable constant. Accordingly, the structure is scalable by multiplying the period and the grating thickness by the same constant.

The dependence of the reflectivity spectrum on various parameters was also evaluated. It can be seen the importance of a low index layer underneath the grating material since there is no reflection band observed below approximately 0.3 μm. Above 0.3 μm, there is no strong influence of the thickness of the low index layer seen. The results also showed that the reflection band occurs only when $(n_L)$ is substantially smaller than $(n_h)$. Therefore, if the $SiO_2$ layer with $(n_L)$=1.47 is replaced with $Si_3N_4$ with $(n_L)$=2, no broadband would occur. Additionally, this configuration showed that for a very thin grating, the mirror is sharp and the optimized bandwidth occurs for $(t_g)$=0.46 μm. The results of fill factor verses wavelength showed reflection peaks, one centered at a wavelength 1.1 μm and the other at 1.6 μm for a fill factor of 0.5. As the fill factor increases, these two peaks merge to form one broad and flat reflection band.

Accordingly, a sub-wavelength grating with very broad bandwidth and high reflectivity is provided. Different center wavelength mirrors can be obtained by simple scaling of the grating dimensions. This unique property will permit the integration with silicon and group III-V based devices such as optical sensors, reconfigurable focal plane arrays and tunable arrays.

EXAMPLE 4

A single layer sub-wavelength grating was fabricated to demonstrate a mirror with a very broad (>500 nm) reflection spectrum from 1.12-1.62 μm ($\Delta\lambda/\lambda$>35%) with very high reflectivity (R>98.5%). Initially, the proposed structure was simulated. Design parameters for the structure include the index of refraction of the materials involved, the thickness of the low index layer under the grating $(t_L)$, the grating period ($\Lambda$), grating thickness $(t_g)$ and the duty cycle. By recursive analysis, all grating parameters were optimized to maximize both reflectivity and spectral coverage. Based on the measured dimensions of the fabricated sub-wavelength grating, the optimized parameters for the simulation were: The high index material was (Poly-Si $(n_h)$=3.48, and the low index material within the grating was air (n=1). The low index material under the grating was $SiO_2$ with $(n_L)$=1.47 with the thickness $(t_L)$=0.58 μm and the thickness $(t_g)$=0.46 μm. The grating period ($\Lambda$) was 0.7 μm and the duty cycle was 68% plus or minus 2%.

The grating in this embodiment was fabricated on a bare silicon wafer using conventional techniques. A silicon dioxide $SiO_2$ layer was grown at 1100° C. Polysilicon was then deposited on top of the oxide layer at 600° C. and a second oxide layer was grown by chemical vapor deposition (PECVD) on top of the polysilicon to serve as a mask for etching the grating. E-beam lithography on PMMA was used for lift off metal (200 Å Cr/80 Å Au) that served as a mask to pattern the top PECVD oxide, which was then etched by RIE. The metal mask was removed and lastly the polysilicon was etched by RIE to form the rectangular grating profile.

The optical measurement setup included a tungsten halogen light source, bifurcated fiber bundle, Glan-Thompson polarizer, focusing lens (NA=0.1) and an optical spectrum analyzer. The trace was normalized using a silver coated mirror in order to eliminate the influence of the blackbody spectrum from both optics and source.

Reflectivity as a function of wavelength for various numbers of duty cycles was recorded. A very broad bandwidth (1.12-1.62 μm) with high reflectivity of R>98.5% was seen with a duty cycle of 66% for linearly polarized light directed perpendicularly to the grating lines. The simulation and experimental results were closely matched. However, the measurements are limited by the sensitivity of the optical spectrum analyzer and low power density of the light source. Small variations in the index of refraction, grating uniformity, roughness of the polysilicon layer and duty cycle variations may slightly alter performance. Improvements in construction techniques should lead to increased performance.

Analysis of the results indicates that the spectral position of the reflection band can be precisely located as it is determined by the grating period ($\Lambda$), which can be controlled very accurately by lithographic methods during fabrication. The duty cycle parameter value is also influenced by small variations in etching or surface roughness. Grating and oxide thickness and other parameters can be optimized to provide consistent performance.

EXAMPLE 5

Single layer wavelength grating reflectors can be used in a number of areas. One use is with MEMS-based optical filters. A scanning Fabry-Perot (FP) etalon with an integrated MEMS drive is at the core of these filters. A conventional etalon includes two mirrors separated by an air gap. The top mirror is supported by a mechanical structure and is directed toward the bottom mirror when a voltage is applied across the top and bottom mirrors. When a voltage is applied and the top mirror moves, the air gap is reduced and the transmission wavelength shifts to the shorter side (i.e. a blue shift). Accordingly, when the etalon gap size is varied, the transmission wavelength varies as well. However, one of the limiting factors of tuning range is the range of physical displacement of the top mirror. The larger the physical displacement of the mirror the greater the tuning range.

Figure 7:
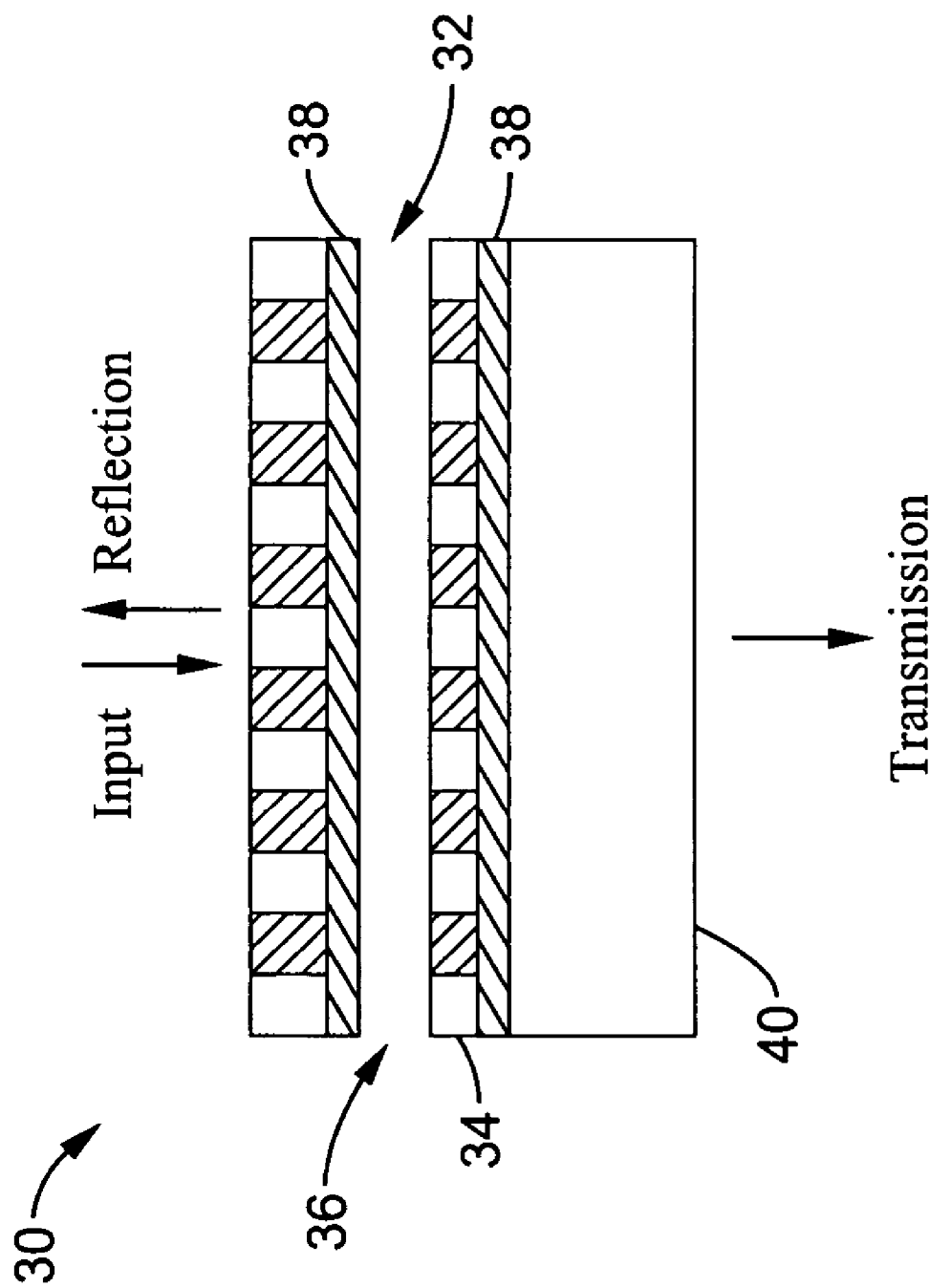
FIG. 7 is a schematic cross-section of a tunable etalon filter consisting of two cascaded a sub-wavelength broadband grating reflectors according to the invention.

Turning now to FIG. 7, a new design of a tunable etalon 30 made with two single layer sub-wavelength gratings is schematically shown. The structure 30 has a top mirror 32, a bottom mirror 34 and a tunable air gap 36. It has been shown that continuous tuning of transmission wavelengths from 11 μm to 8 μm can be achieved with and an air gap 36 size range of 6 to 3 microns. The embodiment shown in FIG. 8 and FIG. 9 has a single pixel 32 of a tunable filter with folded spring contacts 42 that are anchored in the base 44. It can be seen that these units can be set in an array of addressable filters amenable to matrix addressing techniques.

The structure of the sub-wavelength grated reflectors, for purposes of simulations, was a simple 1D grating with a grating period ($\Lambda$) of 4.5 μm, a grating thickness ($t_g$) of 4 μm and the duty cycle at 50%. The indices for the high and low index medium are 3.6 and 1 respectively.

Figure 10:
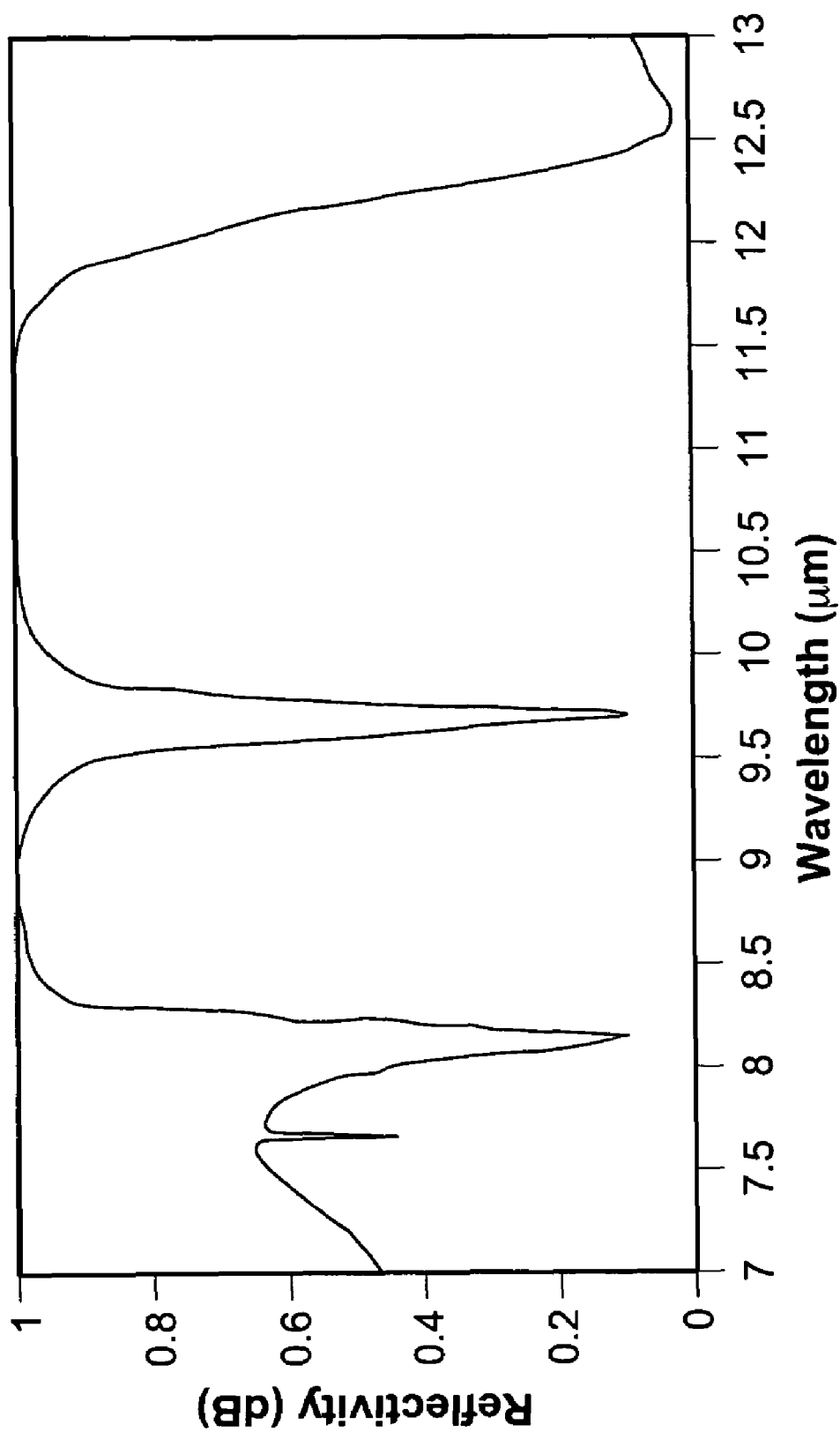
FIG. 10 is a graph of reflection spectra as a function of wavelength for the structure illustrated in FIG. 7.

As expected from a FP etalon, a single narrow passband is produced as seen in FIG. 10. The line width of the passband is determined by the reflectivity of the top and bottom grating mirrors, which can be varied by adjusting the grating period, duty cycle, layer thickness and index contrast. In addition, short and long wavelengths where the reflectivities are zero or go to a local minimum define the mirror band.

Figure 9:
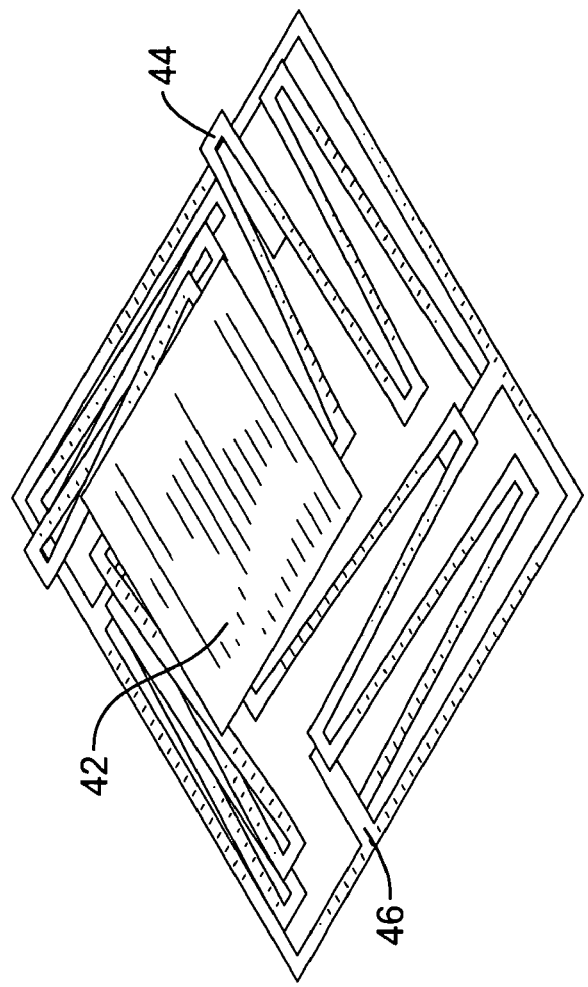
FIG. 9 is a top perspective view of the embodiment of FIG. 8 with the spring contacts vertically displaced.
Figure 8:
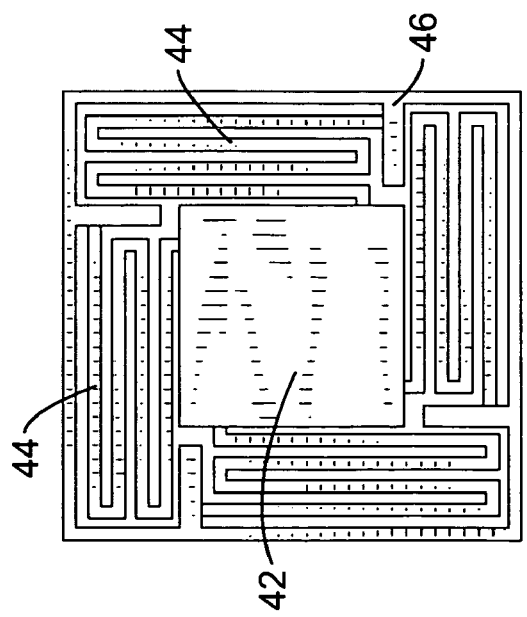
FIG. 8 is a top view of one embodiment of a single pixel of a tunable filter with folded springs.

The folded spring structure 44 in the embodiment shown in FIG. 8 and FIG. 9 will overcome the small fill factor of existing designs while maintaining a reasonable operating voltage. The tradeoff in existing etalon designs is the voltage required to move the mirror and the length of the cantilever or membrane. To restrict the tuning voltage to less than 100 volts, the lever arm lengths are typically several hundred microns in length in existing designs. In the embodiment shown in FIG. 8 and FIG. 9, the spring constant of the folded spring 44 is nearly equivalent to a membrane of the same dimension having its full length extended. The voltage to move the mirror is nearly the same as if the folded spring 44 were fully extended outwards. Accordingly, the fill factor can be greatly improved and pixel size reduced without the compromise of a very high voltage.

It can be seen that varying the length, width and number of folds of the folded arm spring 44 can optimize the tuning voltage. The maximum drive voltage, defined as the voltage required to move the top mirror to reach maximum tuning as a function of filter head size, will support a 50 μm pixel size. With a one pair folded spring design, the filter head can be as large as 28 μm with a 25-volt maximum voltage. The design of the etalon is flexible and can be extended to a wide range of wavelengths by simply scaling the grating dimensions and spring 44 dimensions.

EXAMPLE 6

A tunable optical filter consisting of two cascaded sub-wavelength grating mirrors with a variable air gap, as illustrated in FIG. 7, was analyzed. The parameters of top 32 and bottom 34 gratings are both optimized for R>99% for 1.3-1.8 μm, in order to obtain the narrow transmission linewidth through the Fabry-Perot resonant cavity. The transmission spectra for different air gap distances were calculated using Rigorous Coupled Wave Analysis.

If the top suspending SWG can be actuated by a micromechanical method, a very broad wavelength tuning range of 600 nm can be achieved. Since the thickness of the SWG structure is smaller compared to conventional distributed Bragg reflectors, a lower voltage is required to actuate the device.

In a second analysis, it was possible to achieve broad and continuous (~200 nm) wavelength tuning by varying the air gap 36 between the top 32 and bottom 34 SWG reflectors 34,34. Also, The simulation showed very narrow transmission linewidth (<1 Angstrom) across the entire 200 nm tuning range due to the high reflectivity of the two SWG reflectors. Furthermore, the SWG is insensitive to lateral position on the cascaded structure and easy to be monolithically fabricated with other optoelectronic devices.

In addition, although the analysis was for uniform gratings, nonuniform (such as chirped or sampled) gratings may also be used creating the possibility of engineering the passband lineshape such that it is independent to tuning. This is impossible to do with other tunable filter techniques.

EXAMPLE 7

A potentially important application of the sub-wavelength grating (SWG) is its incorporation in active optoelectronic devices (e.g. lasers and detectors) in order to provide the optical feedback in the surface normal direction. An example of a situation where the sub-wavelength gratings can replace the commonly used semiconductor-based distributed Bragg reflectors (DBR) in a vertical cavity surface emitting laser (VCSEL).

A typical VCSEL consists of two distributed Bragg reflectors (DBR) with a cavity layer in-between. In the center of the cavity layer resides an active region. The active region may consist of multiple layers or single layer of quantum wells or quantum dots. The DBRs may or may not have doping. Current is injected into the active region via a current guiding structure either provided by an oxide aperture or proton-implanted surroundings. The laser emission wavelength is determined by the Fabry-Perot resonance wavelength of the cavity and DBRs, as well as the active region gain bandwidth. For DBRs made of semiconductors, its bandwidth usually limit the emission wavelength. Hence, it is desirable to use a highly reflective and broader bandwidth mirror, such as the SWG described here. Given that the quantum dot gain bandwidth is as wide as 300 nm, it is desirable to use one mirror design to cover the entire spectra.

One SWG-VCSEL design could incorporate two SWG reflectors as the top and bottom mirrors with a cavity layer in-between the two highly reflective SWG mirrors. Another variation of the SWG-VCSEL structure could comprise of one SWG as the top mirror, conventional semiconductor-based DBRs as the bottom mirror, and the cavity layer in-between the two reflectors. Changing the physical spacing between the mirrors in a VCSEL can result in a variation in the Fabry-Perot resonance wavelength and hence its lasing wavelength—tunable VCSEL. This can be accomplished by using SWG-VCSEL as well. The structure of such a tunable SWG-VCSEL device could comprise a sub-wavelength grating, which is freely suspended in air, as the top mirror, an air gap that can be varied by micro-electrical mechanical methods, a cavity layer and a fixed bottom reflector that can be SWG or conventional DBRs.

The sub-wavelength grating (SWG) offers many advantages for the performance and fabrication simplicity of VCSEL, when replacing the DBRs as the mirrors in its optical cavity. One of the major difficulties in the current status of VCSEL fabrication, especially for long wavelength components around 1.55 µm regimes, concerns the realization of high-quality p-type VCSEL-mirror, resulting from the difficulties in the material growth process. In conventional semiconductor-based DBR (e.g. $Al_xGa_{1-x}As$), the refractive index contrast is low between the high and low-index material. Consequently, excess numbers of DBR pairs are required to achieve >99% reflectivity, resulting in the difficulties in the achieving a good quality in the material growth of a thick DBR structure. In addition, the reflectivity of a sub-wavelength grating is polarization dependent—only linearly polarized light in the direction perpendicular to the grating lines would see the broadband and high reflectivity. This intrinsic polarization selectivity nature can be utilized to control the polarization of VCSEL and hence minimize the polarization-dependent noises of the output VCSEL light.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art. All structural, chemical, and functional equivalents to the elements of the above-described preferred embodiment that are known to those of ordinary skill in the art are expressly incorporated herein by reference. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A sub-wavelength grating reflector, comprising:
    a substrate layer;
    a layer of a first low refractive index material on said substrate layer;
    a plurality of separate spaced apart segments of high refractive index material which form a grating on said layer of low index material; and
    a second low refractive index material retained between said segments of high index material, whereby said segments of high refractive index material are surrounded by low refractive index materials;
    wherein the index of refraction of said high index material and the index of refraction of said first and second layer of said low index material have a differential that is greater than one unit.

2. A grating reflector as recited in claim 1, further comprising:
    at least one additional grating comprising separate segments of high index material surrounded by low index materials.

3. A grating reflector as recited in claim 1, wherein said second low index material comprises air.

4. A grating reflector as recited in claim 1, wherein said segments of high refractive index material of said sub-wavelength grating reflector are uniformly spaced apart from one another.

5. A grating reflector as recited in claim 1, wherein said segments of high refractive index material comprise a Group III-V compound.

6. A grating reflector as recited in claim 1, wherein said segments of high refractive index material comprise a Group II-VI compound.

7. A grating reflector as recited in claim 1, wherein said segments of high refractive index material comprise a Group VI element.

8. A grating reflector as recited in claim 1, wherein said segments of high refractive index material is a composition selected from the group of compositions consisting essentially of C, Ge, Si, GaAs, $TiO_2$, ZnSe and organic polymers.

9. A grating reflector as recited in claim 1, wherein said first layer of low refractive index material on said substrate is a material selected from the group of materials consisting essentially of $SiO_2$, $AlO_x$, $MgF_2$, $CaF_2$, and $Si_3N_4$.

10. A grating reflector as recited in claim 1, wherein said spaced apart segments of high refractive index material are non-uniformly spaced.

11. An etalon filter, comprising:
    a first sub-wavelength grating reflector;
    a second sub-wavelength grating reflector substantially parallel to said first reflector and separated by a gap from said first sub-wavelength grating reflector;

wherein said first and second reflectors each comprise a plurality of separate elongated segments of a high refractive index material disposed on a layer of a low index material; and wherein said first and second sub-wavelength grating reflectors are surrounded by additional low index material.

12. An etalon filter as recited in claim 11, further comprising: means for moving said first reflector relative to said second reflector.

13. An etalon filter as recited in claim 12, wherein said means for moving said first reflector relative to said second reflector comprises a micro-electro-mechanical system (MEMS).

14. An etalon filter as recited in claim 13, wherein said MEMS comprises folded spring electrical contacts.

15. An etalon filter as recited in claim 11, wherein said high refractive index and low refractive index materials of said first sub-wavelength grating reflector have a different index than the high refractive index and low refractive index materials of said second sub-wavelength grating reflector.

16. An etalon filter as recited in claim 11, wherein said segments of high refractive index material of said first sub-wavelength grating reflector, or second sub-wavelength grating reflector, or a combination of said first and said second sub-wavelength grating reflectors, are non-uniformly spaced.

17. An etalon filter as recited in claim 11, wherein said segments of high refractive index material comprise a Group II-VI compound.

18. An etalon filter as recited in claim 11, wherein said segments of high refractive index material comprise a Group II-VI compound.

19. An etalon filter as recited in claim 11, wherein said low refractive index material comprises a first layer of low index material beneath the segments of high refractive index materials and a second layer of low refractive index material between said segments of high refractive index material.

20. An etalon filter as recited in claim 19, wherein said first low index material, said second low index material, or a combination of said first and said second low index material comprises air.

21. An etalon filter as recited in claim 11, wherein the index of refraction of said high index material and the index of refraction of said layer of said low index material of said first and second reflectors have a differential that is greater than one unit.

22. An ultra-broadband mirror, comprising:
a first sub-wavelength grating reflector, comprising:
a high refractive index material grating;
a layer of low refractive index surrounding the grating;
at least a second sub-wavelength grating reflector substantially parallel to said first sub-wavelength grating reflector, comprising:
a high refractive index material grating;
a layer of low refractive index material surrounding the grating; and
said high refractive index material gratings comprise a plurality of separate elongated segments of high index material are surrounded by said low refractive index material.

23. A mirror as recited in claim 22, further comprising:
a tunable air gap between said first and second sub-wavelength grating reflectors; and
wherein the distance between said first and second sub-wavelength grating reflectors is configured for being changed.

24. A mirror as recited in claim 22, wherein said low index material separating said high index material segments comprises air.

25. A mirror as recited in claim 22, wherein said high refractive index segments and said low refractive index material of said first and/or second sub-wavelength grating reflectors have a differential that is greater than one unit.

26. A mirror as recited in claim 22, wherein said segments of high refractive index material of said first sub-wavelength grating reflector, or said second sub-wavelength grating reflector, or a combination of said first and said second sub-wavelength grating reflectors are non-uniformly spaced.

27. A mirror as recited in claim 22, wherein said segments of high refractive index material are a composition selected from the group of compositions consisting essentially of Group VI elements, Group II-VI compounds, and Group III-V compounds.

28. A mirror as recited in claim 22, wherein said layer of low refractive index material on said first and/or second sub-wavelength grating reflectors are selected from the group of materials consisting essentially of $SiO_2$, $AlO_x$, $MgF_2$, $CaF_2$, and $Si_3N_4$.

29. An etalon filter as recited in claim 11, wherein said bands of high refractive index material of said first sub-wavelength grating reflector, or said second sub-wavelength grating, or a combination of said first and said second sub-wavelength grating reflectors are uniformly spaced.

30. A mirror as recited in claim 23, wherein said segments of high refractive index material of said first sub-wavelength grating reflector, or said second sub-wavelength grating reflector, or a combination of said first and said second sub-wavelength grating reflectors are uniformly spaced.

31. An etalon filter, comprising:
a first sub-wavelength grating reflector;
a second sub-wavelength grating reflector substantially parallel to said first reflector and separated by a gap from said first sub-wavelength grating reflector;
wherein said first and second reflectors each comprise a plurality of segments of a high refractive index material disposed upon or within a layer of low index material; and
means for moving said first sub-wavelength grating reflector relative to said second sub-wavelength grating reflector.

32. An etalon filter as recited in claim 31, wherein said means for moving said first reflector relative to said second reflector comprises a micro-electro-mechanical system (MEMS).

33. An etalon filter as recited in claim 32, wherein said MEMS comprises folded spring electrical contacts.

34. An etalon filter as recited in claim 31, wherein said high refractive index and low refractive index materials of said first sub-wavelength grating reflector have a different index than the high refractive index and low refractive index materials of said second sub-wavelength grating reflector.

* * * * *